United States Patent
Tanaka et al.

(10) Patent No.: US 7,443,635 B2
(45) Date of Patent: Oct. 28, 2008

(54) MAGNETIC DETECTOR INCLUDING ANTIFERROMAGNETIC LAYER, AMORPHOUS BARRIER LAYER, BASE LAYER, AND HARD LAYER ARRANGED IN THAT ORDER AND METHOD FOR MANUFACTURING MAGNETIC DETECTOR

(75) Inventors: Kenichi Tanaka, Niigata-ken (JP); Eiji Umetsu, Niigata-ken (JP); Masahiro Oshima, Niigata-ken (JP); Naoya Hasegawa, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 318 days.

(21) Appl. No.: 11/249,751

(22) Filed: Oct. 4, 2005

(65) Prior Publication Data

US 2006/0077597 A1 Apr. 13, 2006

(30) Foreign Application Priority Data

Oct. 12, 2004 (JP) ............................. 2004-297229

(51) Int. Cl.
*G11B 5/39* (2006.01)
(52) U.S. Cl. .............. 360/324.1; 29/603.12; 29/603.13; 29/603.14; 29/603.15; 29/603.16
(58) Field of Classification Search ........................ None
See application file for complete search history.

(56) References Cited

U.S. PATENT DOCUMENTS

| | | | | |
|---|---|---|---|---|
| 6,515,573 B1 * | 2/2003 | Dong et al. | ................ | 338/32 R |
| 6,587,316 B2 * | 7/2003 | Hasegawa | ................ | 360/324.1 |
| 6,643,107 B1 * | 11/2003 | Hasegawa et al. | ......... | 360/324.1 |
| 6,731,479 B2 * | 5/2004 | Ooshima et al. | ....... | 360/324.12 |
| 6,844,998 B2 * | 1/2005 | Aoki et al. | .................. | 360/322 |
| 7,054,116 B2 * | 5/2006 | Saito et al. | ............. | 360/324.12 |
| 7,178,222 B2 * | 2/2007 | Hasegawa | ................ | 29/603.13 |
| 7,274,542 B2 * | 9/2007 | Shintani et al. | .......... | 360/324.1 |
| 2002/0051328 A1 | 5/2002 | Hasegawa | | |

FOREIGN PATENT DOCUMENTS

JP 2002-232037 8/2002

\* cited by examiner

*Primary Examiner*—Mark Blouin
(74) *Attorney, Agent, or Firm*—Brinks Hofer Gilson & Lione

(57) ABSTRACT

A multilayer film is placed on a subatrate. The multilayer film includes an antiferromagnetic layer, a pinned magnetic layer, a non-magnetic material layer, and a free magnetic layer. The multilayer film has recessed sections arranged in both side regions thereof, the recessed sections being formed by partly removing the multilayer film in a vacuum. The bottoms of the recessed sections are located between the upper face and lower face of the antiferromagnetic layer. Amorphous barrier layers with a thickness of Å are placed on the bottoms of the recessed sections, the amorphous barrier layers being formed in the same vacuum as that for forming the recessed sections sequentially to the step of forming the recessed sections.

9 Claims, 14 Drawing Sheets

FIG. 8

| | THICKNESS OF AMORPHOUS BARRIER LAYER (Å) | COERCIVE FORCE (Oe) | SQUARENESS RATIO (−) |
|---|---|---|---|
| COMPARATIVE EXAMPLE 1 | 25 | 1270 | 0.79 |
| COMPARATIVE EXAMPLE 2 | 50 | 1060 | 0.79 |
| COMPARATIVE EXAMPLE 3 | 100 | 2460 | 0.78 |
| EXAMPLE | 10 | 1780 | 0.845 |

MAGNETIC DETECTOR INCLUDING ANTIFERROMAGNETIC LAYER, AMORPHOUS BARRIER LAYER, BASE LAYER, AND HARD LAYER ARRANGED IN THAT ORDER AND METHOD FOR MANUFACTURING MAGNETIC DETECTOR

BACKGROUND OF THE INVENTION

1. Field of the Invention

The present invention relates to magnetic detectors for detecting leakage magnetic fields by measuring the change in electrical resistance. The present invention particularly relates to a magnetic detector which includes bias layers with a large coercive force, which has low junction resistance, and which therefore has high output and also relates to a method for manufacturing such a magnetic detector.

2. Description of the Related Art

Japanese Unexamined Patent Application Publication No. 2002-232037 (hereinafter referred to as Patent Document 1) discloses a method for manufacturing a magnetic detector as shown in FIGS. 5 to 10 of Patent Document 1. FIGS. 9 to 13 used herein correspond to FIGS. 5 to 10 of Patent Document 1 and show steps of manufacturing the magnetic detector in such a manner that a face of the magnetic detector is viewed from a recording medium.

In the method disclosed in Patent Document 1, as shown in FIG. 9, the following layers are formed on a lower gap layer 121 in this order: a seed layer 122, an antiferromagnetic layer 123, a first magnetic sub-layer 124a, a non-magnetic intermediate sub-layer 124c, a second magnetic sub-layer 124b, a non-magnetic intermediate layer 125, a free magnetic layer 126, a protective layer 127, and a resist layer 160. The first magnetic sub-layer 124a, the non-magnetic intermediate sub-layer 124c, and the second magnetic sub-layer 124b form a pinned magnetic layer 124. The antiferromagnetic layer 123, the pinned magnetic layer 124, the non-magnetic intermediate layer 125, the free magnetic layer 126, and the protective layer 127 form a multilayer film 131.

As shown in FIG. 10, both side regions of the multilayer film 131 are partly etched off, whereby recessed sections 131a are formed. In this step, the multilayer film 131 is etched such that the recessed sections 131a extend from the protective layer 127 into the antiferromagnetic layer 123.

As shown in FIG. 11, amorphous barrier layers 140 are formed in the recessed sections 131a so as to lie on the antiferromagnetic layer 123. Bias base layers 141 are formed over the amorphous barrier layers 140 and the inside walls 131b of the recessed sections 131a. As shown in FIG. 12, hard bias layers 142 are formed on the bias base layers 141. As shown in FIG. 13, electrode layers 143 and protective layers 144 are formed on the hard bias layers 142 in that order and the resist layer 160 is then removed, whereby the magnetic detector, which is represented by reference numeral 101, is obtained as shown in FIG. 14.

In the magnetic detector 101, since the amorphous barrier layers 140, the bias base layers 141, and the hard bias layers 142 are arranged on the antiferromagnetic layer 123 placed in the recessed sections 131a in that order, the bias base layers 141 are not in contact with the antiferromagnetic layer 123. That is, the amorphous barrier layers 140 having no definite crystalline structure are placed between the antiferromagnetic layer 123 and the bias base layers 141. Therefore, the crystal orientation of the bias base layers 141 is independent from the crystal orientation of the antiferromagnetic layer 123. This leads to an increase in the coercive force (Hc) of the hard bias layers 142 placed on the hard bias layers 142.

In the steps, shown in FIGS. 9 to 13, for manufacturing the magnetic detector 101, the step of etching both side regions of the multilayer film 131 to form the recessed sections 131a as shown in FIG. 10 is assumed to be performed in a vacuum. Furthermore, the step of forming the amorphous barrier layers 140 in the recessed sections 131a as shown in FIG. 11 is also assumed to be performed in a vacuum, as usual.

Although it is not disclosed in Patent Document 1 whether the step of forming the recessed sections 131a as shown in FIG. 10 and the step of forming the amorphous barrier layers 140 as shown in FIG. 11 are sequentially performed in the same vacuum, there is the following description in Paragraph [0148] of Patent Document 1: "etching is performed by ion milling, whereby a substrate including an antiferromagnetic layer with a thickness of 150 Å is prepared; and an amorphous barrier layer with a thickness of 25 Å is then formed on the substrate, whereby each sample is prepared". That is, it is literally clear that the etching step and the amorphous barrier layer-forming step are separately performed. Hence, in the method disclosed in Patent Document 1, the step of etching both side regions of the multilayer film 131 to form the recessed sections 131a and the step of forming the amorphous barrier layers 140 in the recessed sections 131a are assumed not to be sequentially performed in the same vacuum.

The inventors have found that when the recessed sections 131a and the amorphous barrier layers 140 are non-sequentially formed in different vacuums, the hard bias layers 142 cannot have a large coercive force (Hc) unless the amorphous barrier layers 140 have a large thickness.

When the amorphous barrier layers 140 have a larger thickness, the amorphous barrier layers 140 have a larger portions in contact with the inside walls 131b. Therefore, when currents are applied between the electrode layers 143, currents flow in the portions of the amorphous barrier layers 140 that are in contact with the inside walls 131b. That is, an increase in the area of the portions of the amorphous barrier layers 140 that are in contact with the inside walls 131b causes a problem of an increase in junction resistance.

SUMMARY OF THE INVENTION

The present invention has been made to solve the above problem. It is an object of the present invention to provide a magnetic detector which includes bias layers with a large coercive force and which has low junction resistance. It is another object of the present invention to provide a method for manufacturing such a magnetic detector.

A magnetic detector according to the present invention includes a substrate; a multilayer film, placed above the substrate, including an antiferromagnetic layer, a pinned magnetic layer, a non-magnetic conductive layer, and a free magnetic layer; and recessed sections located in both side regions of the multilayer film. The bottoms of the recessed sections are located between the upper face and lower face of the antiferromagnetic layer. The recessed sections contain amorphous barrier layers, placed on the bottoms thereof, having a thickness of 10 to 32 Å. The amorphous barrier layers have bias base layers, bias layers, and electrode layers arranged thereon.

In the magnetic detector, even if the amorphous barrier layers have a thickness of about 10 Å, the bias layers have a large coercive force (Hc) and squareness ratio (S). Since the amorphous barrier layers are formed by sputtering using an insulating material so as to have a thickness of 32 Å or less, only small portions of the amorphous barrier layers are in contact with the inside walls of the recessed sections. This prevents a problem that currents flow in the portions of the amorphous barrier layers that are in contact with the inside walls when currents are applied between the electrode layers. That is, a problem of an increase in junction resistance can be prevented. This leads to an increase in output.

The amorphous barrier layers may be made of an amorphous oxide containing at least one selected from the group consisting of Al, Cr, Ga, Si, Sn, Ta, Ti, Zn, and Zr.

Alternatively, the amorphous barrier layers may be made of at least one selected from the group consisting of $Al_2O_3$, $Ta_2O_5$, and $SiO_2$.

The amorphous barrier layers may be made of an amorphous alloy containing at least one selected from the group consisting of Ta, Au, Ag, Cu, Mn, Nb, and Pd. The amorphous barrier layers may be made of Ta.

A method for manufacturing a magnetic detector according to the present invention includes Step (a) of forming a multilayer film above the substrate, the multilayer film including an antiferromagnetic layer, a pinned magnetic layer, a non-magnetic conductive layer, and a free magnetic layer; Step (b) of removing both side regions of the multilayer film in a vacuum to form recessed sections such that the bottoms of the recessed sections are located between the upper face and lower face of the antiferromagnetic layer; Step (c) of forming amorphous barrier layers on the bottoms of the recessed sections sequentially to Step (b) in the same vacuum as that used in Step (b) without breaking the vacuum state of Step (b); and Step (d) of forming bias base layers, bias layers, and electrode layers on the amorphous barrier layers.

In the method, Step (b) of forming the recessed sections and Step (c) of forming amorphous barrier layers are sequentially performed in the same vacuum. Since the amorphous barrier layers and the recessed sections are sequentially formed in the same vacuum, the bias layers have a large coercive force (Hc) and squareness ratio (S) even if the amorphous barrier layers have a smaller thickness as compared to those that are formed non-sequentially to the step of forming the recessed sections after the vacuum is broken. Therefore, in the magnetic detector manufactured by the method, the bias layers have a large coercive force (Hc) and squareness ratio (S) even if the amorphous barrier layers have a thickness less than that of known amorphous barrier layers. Since the amorphous barrier layers can have a small thickness, only small portions of the amorphous barrier layers are in contact with the inside walls of the recessed sections. This prevents a problem that currents flow in the portions of the amorphous barrier layers that are in contact with the inside walls when currents are applied between the electrode layers. That is, a problem of an increase in junction resistance can be prevented. This leads to an increase in output.

In the method, the amorphous barrier layers are formed in Step (c) so as to have a thickness of 10 to 32 Å.

According to such a configuration, the bias layers have a large coercive force (Hc) and squareness ratio (S) and the portions of the amorphous barrier layers that are in contact with the inside walls of the recessed sections are very small. This leads to a reduction in junction resistance.

The amorphous barrier layers may be formed in Step (c) using an amorphous oxide containing at least one selected from the group consisting of Al, Cr, Ga, Si, Sn, Ta, Ti, Zn, and Zr.

Alternatively, the amorphous barrier layers may be formed in Step (c) using at least one selected from the group consisting of $Al_2O_3$, $Ta_2O_5$, and $SiO_2$.

The amorphous barrier layers may be formed in Step (c) using an amorphous alloy containing at least one selected from the group consisting of Ta, Au, Ag, Cu, Mn, Nb, and Pd. The amorphous barrier layers may be formed in Step (c) using Ta.

Furthermore, the amorphous barrier layers may be formed in Step (c) by sputtering performed in the direction making an angle θ1 with the normal to the bottoms of the recessed sections.

According to such a configuration, since the amorphous barrier layers can be formed such that the upper faces thereof are arbitrarily parallel to the bottoms of the recessed sections, the portions of the amorphous barrier layers that are in contact with the inside walls of the recessed sections are very small. This leads to a reduction in junction resistance.

The angle θ1 may be in the range of 0 to 10 degrees. This leads to a reduction in junction resistance.

In the magnetic detector according to the present invention, even if the amorphous barrier layers have a thickness of about 10 Å, the bias layers have a large coercive force (Hc) and squareness ratio (S). Since the amorphous barrier layers are formed by sputtering using an insulating material so as to have a thickness of 32 Å or less, the portions of the amorphous barrier layers that are in contact with the inside walls of the recessed sections are very small. This prevents a problem that currents flow in the portions of the amorphous barrier layers that are in contact with the inside walls when currents are applied between the electrode layers. That is, a problem of an increase in junction resistance can be prevented. This leads to an increase in output.

In the method according to the present invention, the step of forming the recessed sections in the multilayer film and the step of forming amorphous barrier layers are sequentially performed in the same vacuum. Since the amorphous barrier layers and the recessed sections are sequentially formed in the same vacuum, the bias layers have a large coercive force (Hc) and squareness ratio (S) even if the amorphous barrier layers have a smaller thickness as compared to those that are formed non-sequentially to the step of forming the recessed sections after the vacuum is broken. Therefore, in the magnetic detector manufactured by the method, the bias layers have a large coercive force (Hc) and squareness ratio (S) even if the amorphous barrier layers have a thickness less than that of known amorphous barrier layers. This leads to an increase in output.

Since the amorphous barrier layers have a small thickness, the portions of the amorphous barrier layers that are in contact with the inside walls of the recessed sections are very small. This prevents a problem that currents flow in the portions of the amorphous barrier layers that are in contact with the inside walls when currents are applied between the electrode layers. That is, a problem of an increase in junction resistance can be prevented. This leads to an increase in output.

BRIEF DESCRIPTION OF THE DRAWINGS

FIG. 8 is a table showing magnetic properties of samples of comparative example and those of a sample of an example of the present invention;

DESCRIPTION OF THE PREFERRED EMBODIMENTS

Figure 1:
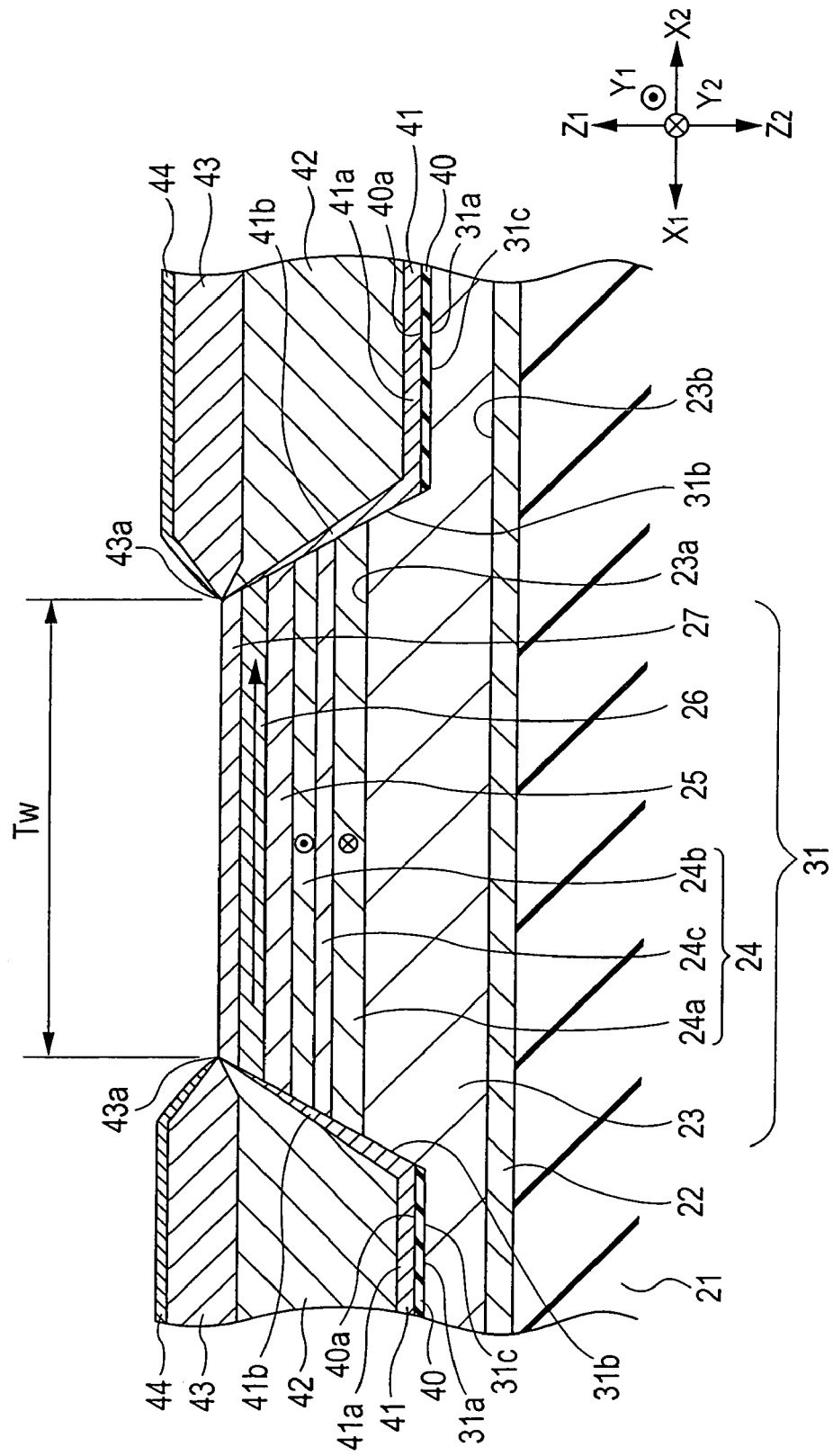
FIG. 1 is a fragmentary sectional view showing a magnetic detector according to an embodiment of the present invention in such a manner that a face of the magnetic detector is viewed from a recording medium.

FIG. 1 is a fragmentary sectional view showing a magnetic detector 1 according to an embodiment of the present invention in such a manner that a face of the magnetic detector 1 is viewed from a recording medium.

The magnetic detector 1 is a component of a GMR head, which is a type of magnetic head, included in a hard disc drive. The GMR head is used to reproduce external signals recorded on the recording medium. Although FIG. 1 shows only the magnetic detector 1 included in the GMR head, the GMR head may have an inductive head, placed thereon, for recording. The inductive head includes a core layer made of a magnetic material and a coil layer.

The magnetic detector 1 is placed on the trailing edge of a slider made of alumina-titanium carbide ($Al_2O_3$—TiC). The slider has a face which is located on the side opposite to the recording medium and which is bonded to a flexible support member made of stainless steel. These components are included in a magnetic head device.

With reference to FIG. 1, reference numeral 21 represents a lower gap layer made of an insulating material such as $Al_2O_3$ or $SiO_2$. The lower gap layer 21 is placed on a substrate which is not shown.

The lower gap layer 21 has a seed layer 22 placed thereon. The seed layer 22 is made of a non-magnetic or magnetic material in which the (111) planes of face-centered cubic crystals or the (110) planes of body-centered cubic crystals are oriented in parallel to the interface between the seed layer 22 and an antiferromagnetic layer 23 described below. In particular, the seed layer 22 is preferably made of a high resistance material. The seed layer 22 may be made of, for example, an alloy having the formula Ni-Fe-Y, wherein Y is at least one selected from the group consisting of Cr, Rh, Ta, Hf, Nb, Zr, and Ti. The seed layer 22 preferably has a thickness of about 10 to 100 Å.

The antiferromagnetic layer 23 is placed on the seed layer 22. The antiferromagnetic layer 23 is preferably made of an antiferromagnetic material containing Mn and Element X that is at least one selected from the group consisting of Pt, Pd, Ir, Rh, Ru, and Os. Alternatively, the antiferromagnetic layer 23 may be made of another antiferromagnetic material containing Mn and an alloy containing Element X and Element X 'that include at least one selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and a rare-earth element.

These antiferromagnetic materials have high corrosion resistance and blocking temperature and are capable of generating a large exchange coupling magnetic field at the interface between the antiferromagnetic layer 23 and a pinned magnetic layer 24 described below. The antiferromagnetic layer 23 preferably has a thickness of about 50 to 250 Å.

Since the (111) planes of the face-centered cubic crystals or the (110) planes of the body-centered cubic crystals in the seed layer 22 are oriented in parallel to the interface between the seed layer 22 and the antiferromagnetic layer 23 as described above, the (111) planes of crystals in the antiferromagnetic layer 23 placed on the seed layer 22 and the (111) planes of crystals in layers placed on the antiferromagnetic layer 23 can be oriented in parallel to the above interface. This leads to an increase in crystal grain size, resulting in an increase in resistance changing rate (ΔMR).

The pinned magnetic layer 24 is placed on the antiferromagnetic layer 23. With reference to FIG. 1, in this embodiment, the pinned magnetic layer 24 includes a first magnetic sub-layer 24a, a non-magnetic intermediate sub-layer 24c, and a second magnetic sub-layer 24b arranged in that order and has a multi-layered ferri-structure.

The first and second magnetic sub-layers 24a and 24b are preferably made of a ferromagnetic material. Examples of such a ferromagnetic material include a Ni—Fe alloy, Co, a Co—Ni—Fe alloy, a Co—Fe alloy, and a Co—Ni alloy. The first and second magnetic sub-layers 24a and 24b are preferably made of the same material.

The non-magnetic intermediate sub-layer 24c is made of a non-magnetic material, for example, an alloy containing at least one selected from the group consisting of Ru, Rh, Ir, Cr, Re, and Cu.

In this embodiment, the pinned magnetic layer 24 has such a multi-layered ferri-structure as shown in FIG. 1 and may have a magnetic single-layer structure or a multilayer structure.

With reference to FIG. 1, in this embodiment, the magnetization of the first magnetic sub-layer 24a is pinned in the Y2 direction and that of the second magnetic sub-layer 24b is pinned in the direction (the Y1 direction) opposite to the Y2 direction.

The pinned magnetic layer 24 has a thickness of about 20 to 60 Å.

The pinned magnetic layer 24 has a non-magnetic material layer 25 placed thereon. The non-magnetic material layer 25 is made of a conductive material, such as Cu, having low electrical resistance. The non-magnetic material layer 25 has a thickness of about 25 Å.

The non-magnetic material layer 25 has a free magnetic layer 26 placed thereon. The free magnetic layer 26 is made of, for example, a Ni—Fe alloy, a Co—Fe alloy, Co, a Co—Ni—Fe alloy, or another alloy. The free magnetic layer 26 has a thickness of about 20 to 40 Å.

The free magnetic layer 26 has a protective layer 27 placed thereon. The protective layer 27 is made of, for example, Ta and has a thickness of about 30 Å.

With reference to FIG. 1, in this embodiment, the antiferromagnetic layer 23, the pinned magnetic layer 24, the non-magnetic material layer 25, the free magnetic layer 26, and the protective layer 27 form a multilayer film 31.

In the present invention, as shown in FIG. 1, the multilayer film 31 has recessed sections 31a placed in side regions thereof, the side regions being arranged in the width direction (the X1-X2 direction in this figure) of a track. The recessed sections 31a have inside walls 31b which are uniformly sloped from the upper face 27a of the protective layer 27 to inner portions (intermediate portions) of the antiferromagnetic layer 23 in the thickness direction (the Z1-Z2 direction in this figure) of the antiferromagnetic layer 23. The bottoms 31c of the recessed sections 31a are located at intermediate positions of the antiferromagnetic layer 23 in the thickness direction thereof. That is, the bottoms 31c thereof are located between (or at positions between) the upper face 23a and lower face 23b of the antiferromagnetic layer 23. Therefore, the antiferromagnetic layer 23 is partly exposed at the bottoms 31c of the recessed sections 31a.

The inside walls 31b need not be uniformly sloped and may be uniformly curved.

The recessed sections 31a each contain corresponding amorphous barrier layers 40 placed on the bottoms 31c thereof.

The amorphous barrier layers 40 have bias base layers 41, bias layers 42, electrode layers 43, and protective layers 44 arranged thereon in that order.

The bias base layers 41 extend over the upper faces 40a of the amorphous barrier layers 40 and the inside walls 31b of the multilayer film 31. The bias base layers 41 each have corresponding flat sections 41a lying on the amorphous barrier layers 40 and extending sections 41b extending on the inside walls 31b of the multilayer film 31 toward the protective layers 44.

The bias base layers 41 may be made of a non-magnetic material containing at least one selected from the group consisting of Cr, W, Mo, V, Mn, Nb, and Ta.

The flat sections 41a of the bias base layers 41 have a thickness of, for example, 15 to 75 Å and have a function of effectively increasing the coercive force and squareness ratio of the bias layers 42.

The bias layers 42 are each placed on the corresponding bias base layers 41. The bias layers 42 are magnetized in the X2 or X1 direction in this figure. The magnetization of the free magnetic layer 26 is pinned in the X1 or X2 direction because bias magnetic fields of bias layers 42 are pinned in the X1 or X2 direction. The bias layers 42 may be made of a cobalt-platinum (Co—Pt) alloy, a cobalt-chromium-platinum (Co—Cr—Pt) alloy, or another alloy. The bias layers 42 have a thickness of about 100 to 400 Å.

The electrode layers 43 contain Cr, Au, Ta, W, or another element and each lie on the corresponding bias layers 42. The protective layers 44 contain, for example, Ta and each lie on the corresponding electrode layers 43. The protective layers 44 have a thickness of about 50 Å.

In the magnetic detector 1 shown in FIG. 1, the distance between the inside end portions 43a of the electrode layers 43 arranged in the width direction (the X1-X2 direction in this figure) of a track is referred to as "track width Tw".

Crystals in the bias base layers 41 have a body-centered cubic (bcc) structure. The (200) planes of the crystals in the bias base layers 41 are oriented in a direction (the X1-X2 direction in this figure) parallel to the interfaces between the bias layers 42 and the flat sections 41a of the bias base layers 41. Crystals in the bias layers 42 have a hexagonal close-packed (hcp) structure. The {100} planes of the crystals in the bias layers 42 are oriented in a direction (the X direction in this figure) parallel to the free magnetic layer 26.

Since the crystals in the bias base layers 41 have a body-centered cubic (bcc) structure and the (200) planes of the crystals therein are oriented in parallel to the interfaces between the bias layers 42 and the flat sections 41a of the bias base layers 41, the crystals in the bias layers 42 placed on the bias base layers 41 have a hexagonal close-packed (hcp) structure and the {100} planes of the crystals therein are oriented in parallel to the interfaces between the bias layers 42 and the flat sections 41a of the bias base layers 41.

Since the {100} planes of the crystals in the bias layers 42 are oriented in parallel to the interfaces between the bias layers 42 and the flat sections 41a of the bias base layers 41, the {100} planes of the crystals in the bias layers 42 are oriented in parallel to the free magnetic layer 26. That is, the c-axes of the crystals in the bias layers 42 are oriented in a direction (the X direction in this figure) parallel to the free magnetic layer 26. This is effective in generating bias magnetic fields. Furthermore, the coercive force and squareness ratio of the bias layers 42 can be increased. This leads to a reduction in Barkhausen noise in the magnetic detector 1, resulting in an increase in sensitivity to magnetic fields.

In the magnetic detector 1 of the present invention, the bottoms 31c of the recessed sections 31a are located at intermediate portions of the antiferromagnetic layer 23 in the thickness direction of the antiferromagnetic layer 23. Therefore, when the bias layers 42 are formed in the recessed sections 31a, end portions of the bias layers 42 that are located close to the free magnetic layer 26 can be prevented from being extremely tapered. This is effective in applying a bias magnetic field to the free magnetic layer 26, resulting in the enhancement of the linearity and stability of reproduced waveform.

In the magnetic detector 1 of the present invention, since the amorphous barrier layers 40 are placed between the antiferromagnetic layer 23 and the bias base layers 41, the crystal orientation of the bias base layers 41 placed on the amorphous barrier layers 40 and that of the bias layers 42 are independent from the crystal orientation of the antiferromagnetic layer 23 placed under the amorphous barrier layers 40. That is, the amorphous barrier layers 40 have a function of shielding the bias base layers 41 from the influence of the antiferromagnetic layer 23.

Since the bias base layers 41 are independent from the crystal orientation of the antiferromagnetic layer 23 and only the bias layers 42 are affected from the crystal orientation of the bias base layers 41 placed under the bias layers 42, the crystals in the bias layers 42 have a hexagonal close-packed (hcp) structure. This leads to the efficient generation of bias magnetic fields, the enhancement of the coercive force and squareness ratio of the bias layers 42, a reduction in Barkhausen noise in the magnetic detector 1, and an increase in sensitivity to magnetic fields.

The amorphous barrier layers 40 need to have a function of preventing the influence of the antiferromagnetic layer 23. In order to prevent that the flow of a sense current in the antiferromagnetic layer 23 causes a reduction in the output of the magnetic detector 1, the amorphous barrier layers 40 preferably have electrical insulating properties.

The amorphous barrier layers 40 are preferably made of an amorphous oxide containing at least one selected from the group consisting of Al, Cr, Ga, Si, Sn, Ta, Ti, Zn, and Zr.

Alternatively, the amorphous barrier layers 40 may be made of Ta.

Furthermore, the amorphous barrier layers 40 may be made of an amorphous alloy containing at least one selected from the group consisting of Ta, Au, Ag, Cu, Mn, Nb, and Pd.

In particular, at least one of $Al_2O_3$, $Ta_2O_5$, and $SiO_2$ is preferably used to prepare the amorphous barrier layers 40.

When the amorphous barrier layers 40 are made of an insulating material, the amorphous barrier layers 40 preferably have a thickness of less than 35 Å. If the amorphous barrier layers 40 are formed by a sputtering process so as to have a thickness of less than 35 Å, the amorphous barrier layers 40 have very small portions in contact with the inside walls 31b of the recessed sections 31a. This prevents a problem that currents flow in the portions of the amorphous barrier layers 40 that are in contact with the inside walls 31b when currents are applied between the electrode layers 43. That is, a problem of an increase in junction resistance can be prevented.

In the present invention, the recessed sections 31a and the amorphous barrier layers 40 are sequentially formed in the same vacuum as described below. Since the recessed sections 31a and the amorphous barrier layers 40 are sequentially formed in the same vacuum, the bias layers 42 have a larger coercive force (Hc) and squareness ratio (S) even if the bias layers 42 have a smaller thickness as compared to those formed in a vacuum different from a vacuum for forming the recessed sections 31a. Therefore, in the magnetic detector 1 of the present invention, the amorphous barrier layers 40 have a thickness of less than 35 Å, which is smaller than that of known ones. Furthermore, even if the amorphous barrier layers 40 have a thickness of about 10 Å, the amorphous barrier layers 40 have a large coercive force (Hc) and squareness ratio (S) and the junction resistance can be reduced as described above. This leads to an increase in output.

Since the bottoms 31c of the recessed sections 31a containing the amorphous barrier layers 40 are located higher than the lower face 23b of the antiferromagnetic layer 23, the upper faces 40a of the amorphous barrier layers 40 are located higher than the lower face 23b of the antiferromagnetic layer 23. Therefore, the bias layers 42 are located at high positions in the recessed sections 31a in the thickness direction (the Z1-Z2 direction in this figure); hence, portions of the bias layers 42 that extend on the inside walls 31b of the recessed sections 31a toward the protective layers 44 can be prevented from being extremely tapered. The extending portions of the bias layers 42 arranged on both sides of the free magnetic layer 26 have a sufficiently large volume; hence, a large bias magnetic field can be applied to the free magnetic layer 26.

A method for manufacturing the magnetic detector 1 shown in FIG. 1 will now be described with reference to FIGS. 2 to 6.

Figure 2:
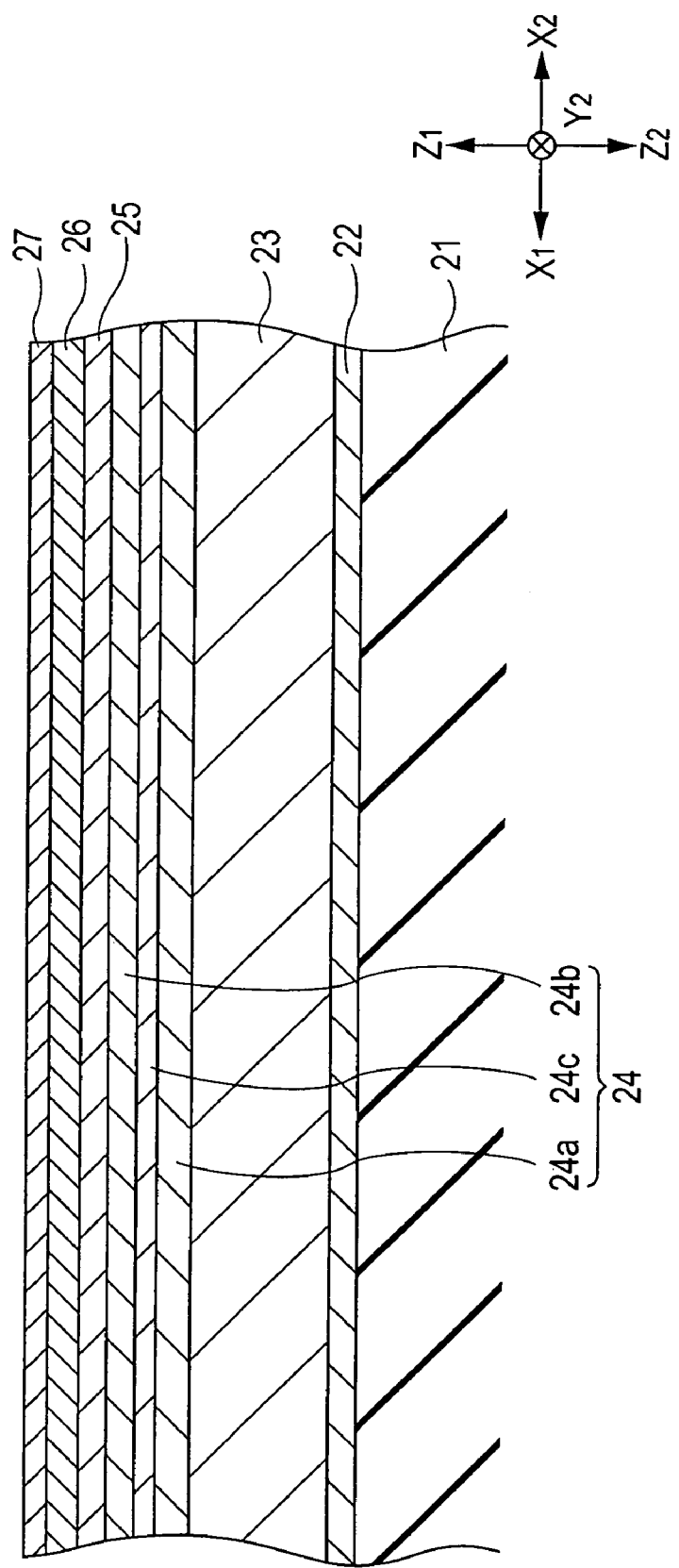
FIG. 2 is an illustration showing a step included in a method for manufacturing the magnetic detector shown in FIG. 1.

As shown in FIG. 2, the following layers that form the multilayer film 31 are formed on the lower gap layer 21 placed on the substrate, which is not shown, by a sputtering or deposition process in sequential steps in this order: the seed layer 22; the antiferromagnetic layer 23; the pinned magnetic layer 24 including the first magnetic sub-layer 24a, the non-magnetic intermediate sub-layer 24c, the second magnetic sub-layer 24b; the non-magnetic material layer 25; the free magnetic layer 26; and the protective layer 27. Examples of the sputtering process include a DC magnetron sputtering process, a RF sputtering process, an ion beam sputtering process, a long-throw sputtering process, and a collimation sputtering process. The term "sequential steps" herein used means steps that are sequentially performed in the same vacuum in a vacuum deposition system without breaking the vacuum. This is applied to descriptions below.

After the multilayer film 31 including the protective layer 27 is formed on the lower gap layer 21, the multilayer film 31 is annealed in a first magnetic field. The multilayer film 31 is heat-treated at a first heat-treating temperature in such a manner that the first magnetic field (the Y2 direction in this figure) perpendicular to the track width Tw (the X1-X2 direction in this figure) is applied to the multilayer film 31, whereby an exchange coupling magnetic field is generated between the antiferromagnetic layer 23 and the first magnetic sub-layer 24a included in the pinned magnetic layer 24. Hence, the first magnetic sub-layer 24a is magnetized in the Y2 direction in this figure. On the other hand, the second magnetic sub-layer 24b is magnetized by exchange coupling, due to the RKKY interaction between the first magnetic sub-layer 24a and the second magnetic sub-layer 24b, in the Y1 direction in this figure. The first heat-treating temperature is, for example, 270° C. and the magnitude of the first magnetic field is about 800 (kA/m).

Figure 3:
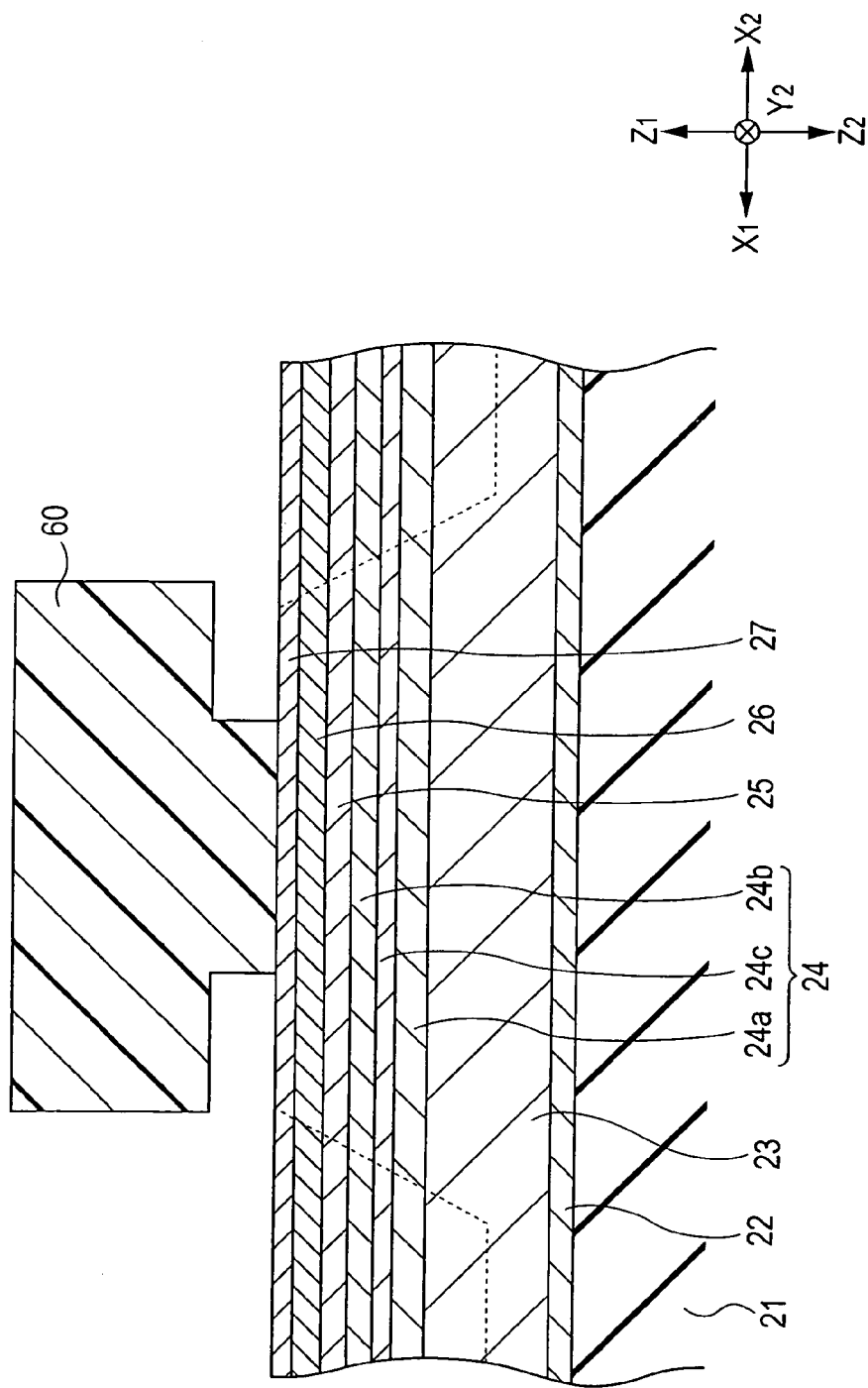
FIG. 3 is an illustration showing a step subsequent to the step shown in FIG. 2.
Figure 4:
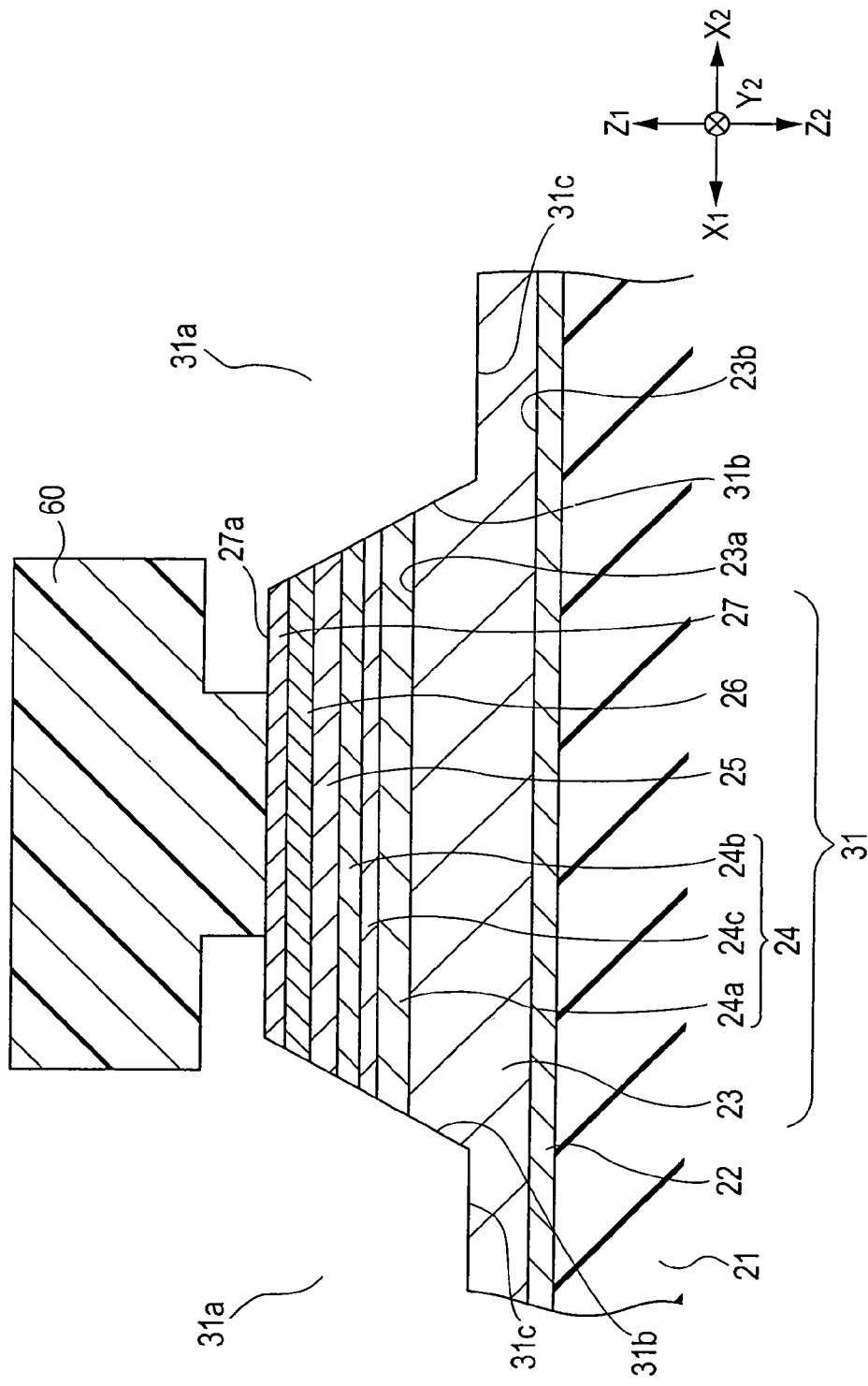
FIG. 4 is an illustration showing a step subsequent to the step shown in FIG. 3.

In the step shown in FIG. 3, a resist layer 60 for lift-off is formed on the protective layer 27. After the resist layer 60 is formed on the protective layer 27, regions of the multilayer film 31 are removed by a known process such as an ion milling process, the regions being exposed from the resist layer 60 and indicated by dotted lines. This leads to the removal of the exposed regions of the multilayer film 31, resulting in the formation of the recessed sections 31a in the multilayer film 31. FIG. 4 shows this situation.

With reference to FIG. 4, the inside walls 31b of the recessed sections 31a are uniformly sloped from the upper face 27a of the protective layer 27 to inner portions (intermediate portions) of the antiferromagnetic layer 23 in the thickness direction (the Z1-Z2 direction in this figure) of the antiferromagnetic layer 23. The bottoms 31c of the recessed sections 31a are located at intermediate positions of the antiferromagnetic layer 23 in the thickness direction thereof. That is, the bottoms 31c thereof are located between the upper face 23a and lower face 23b of the antiferromagnetic layer 23. Therefore, the antiferromagnetic layer 23 is partly exposed at the bottoms 31c of the recessed sections 31a. The inside walls 31b need not be uniformly sloped and may be uniformly curved.

Figure 5:
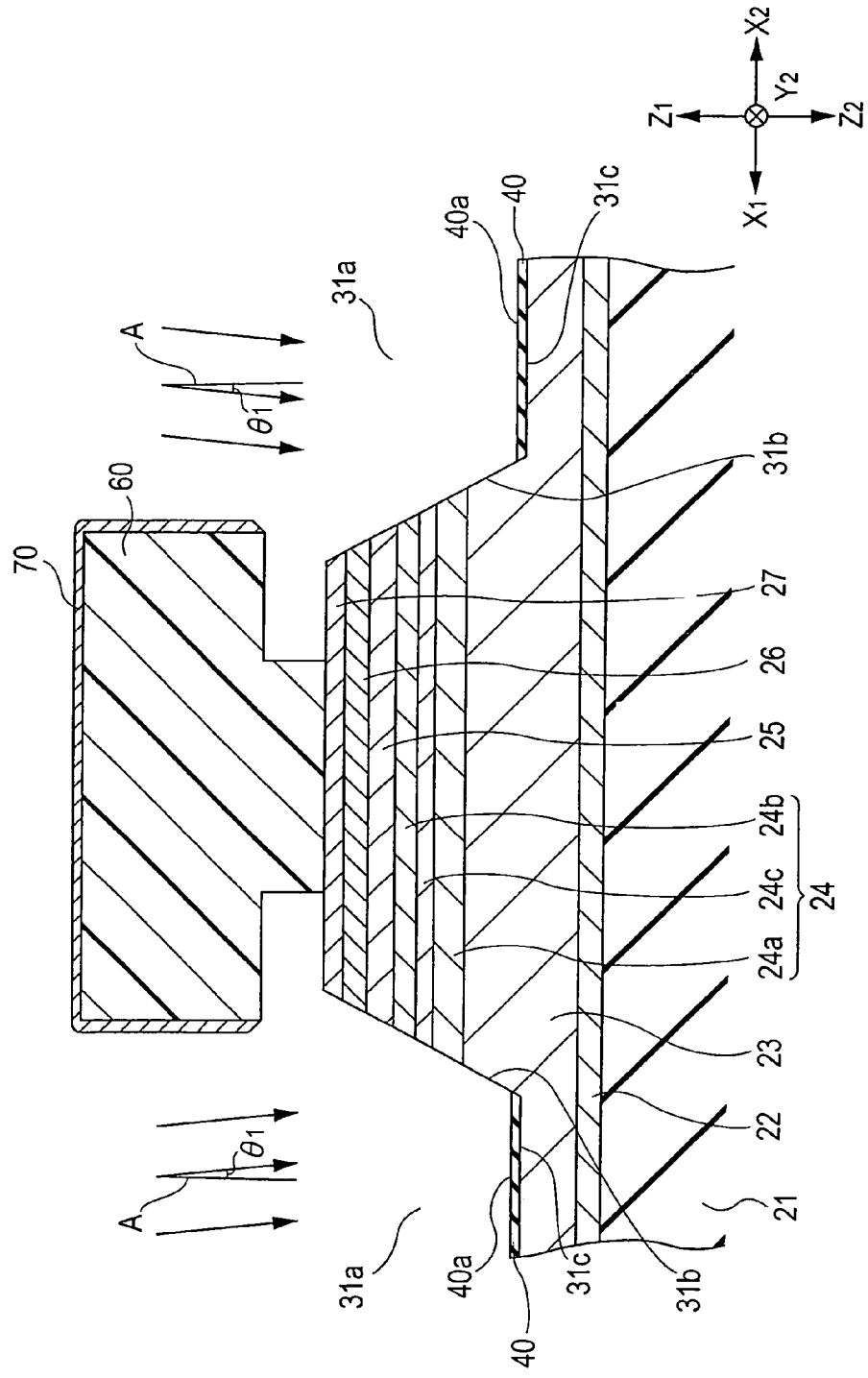
FIG. 5 is an illustration showing a step subsequent to the step shown in FIG. 4.

As shown in FIG. 5, the amorphous barrier layers 40 are formed on the bottoms 31c of the recessed sections 31a by a sputtering process or another process in the same vacuum for performing the steps shown in FIGS. 3 and 4 without breaking the vacuum. In this step, as shown in FIG. 5, sputtering is performed in the direction making an angle θ1 with Normal A to the bottoms 31c of the recessed sections 31a. The angle θ1 is preferably in the range of 0 to 10 degrees. When the angle θ1 is in this range, the amorphous barrier layers 40 can be formed such that the upper faces 40a thereof are substantially parallel to the bottoms 31c of the recessed sections 31a; hence, the portions of the amorphous barrier. layers 40 that are in contact with the inside walls 31b of the recessed sections 31a are very small. This prevents a problem that currents flow in the portions of the amorphous barrier layers 40 that are in contact with the inside walls 31b when currents are applied between the electrode layers 43. That is, a problem of an increase in junction resistance can be prevented.

In order to reduce the junction resistance, the amorphous barrier layers 40 preferably have a thickness of less than 32 Å. In order to increase the coercive force (Hc) and the squareness ratio (S), the amorphous barrier layers 40 preferably have a thickness of 10 Å or more.

When the amorphous barrier layers 40 are formed, a first material layer 70 made of the same material as that for forming the amorphous barrier layers 40 is formed on the resist layer 60.

Figure 6:
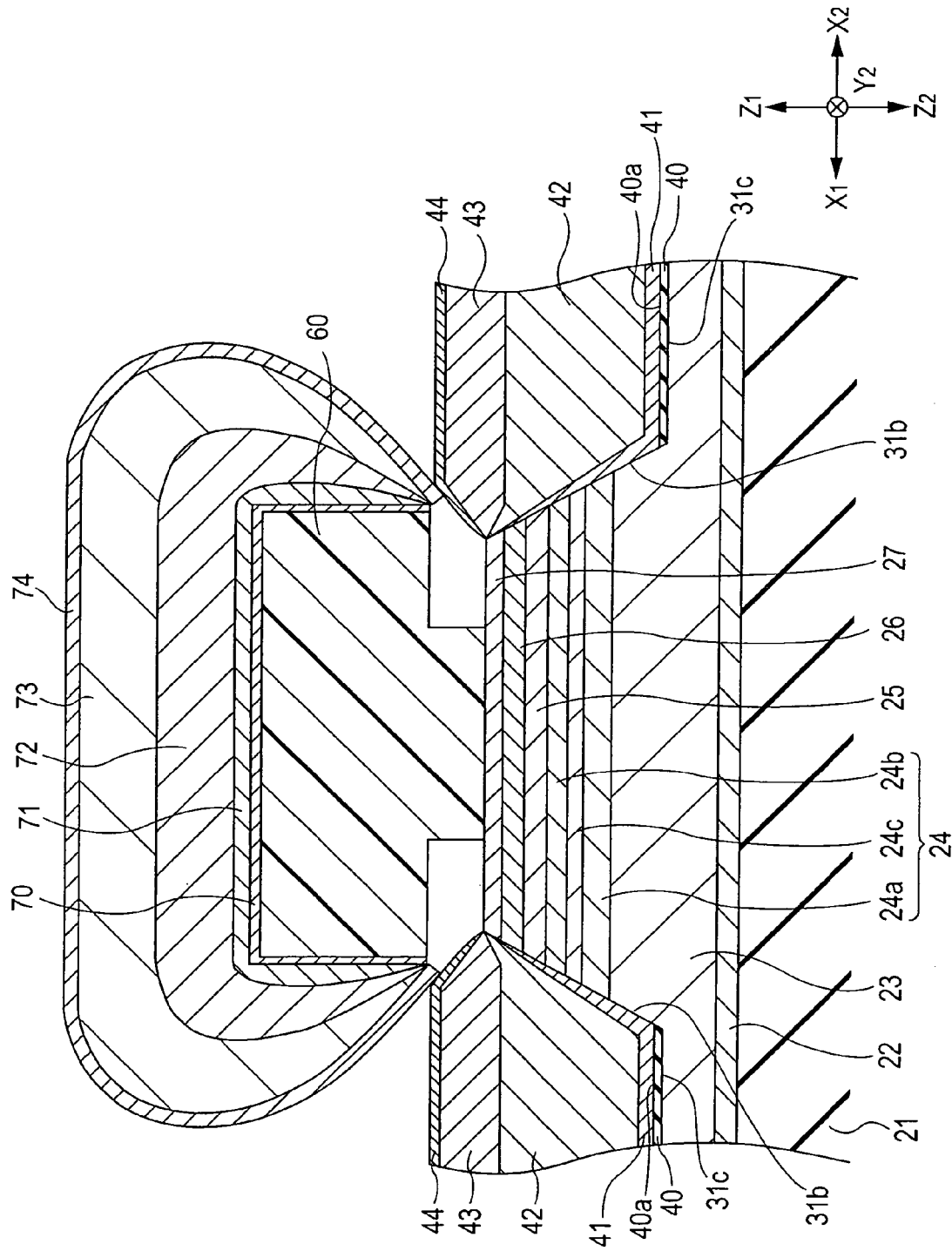
FIG. 6 is an illustration showing a step subsequent to the step shown in FIG. 5.

As shown in FIG. 6, the bias base layers 41 are formed over the amorphous barrier layers 40 and the inside walls 31b of the recessed sections 31a by a known process such as a sputtering process or a deposition process. The bias layers 42, the electrode layers 43, and the protective layers 44 are formed on the bias base layers 41 in that order by a known process such as a sputtering process or a deposition process.

In this step, the following layers are formed on the first material layer 70 placed on the resist layer 60: a second material layer 71 made of the same material as that for forming the bias base layers 41, a third material layer 72 made of the same material as that for forming the bias layers 42, a fourth material layer 73 made of the same material as that for forming the electrode layers 43, and a fifth material layer 74 made of the same material as that for forming the protective layers 44.

In the present invention, the step of forming the recessed sections 31a shown in FIG. 3 or 4 and the step of forming the amorphous barrier layers 40 shown in FIG. 5 are sequentially performed in the same vacuum in the vacuum deposition system. Since the amorphous barrier layers 40 and the recessed sections 31a are sequentially formed in the same vacuum, the bias layers 42 have a larger coercive force (Hc) and squareness ratio (S) even if the bias layers 42 have a smaller thickness as compared to those that are formed non-sequentially to the step of forming the recessed sections after the vacuum is broken and the bottoms 31c that are portions of the antiferromagnetic layer 23 are therefore exposed to air. Therefore, in the magnetic detector 1 of the present invention, the amorphous barrier layers 40 can have a large coercive force (Hc) and squareness ratio (S) although the amorphous barrier layers 40 have a thickness smaller than that of known ones, that is, a thickness of less than 32 Å and even if the amorphous barrier layers 40 have a thickness of about 10 Å. This leads to an increase in output.

Since the amorphous barrier layers 40 can have a small thickness, the portions of the amorphous barrier layers 40 that are in contact with the inside walls 31b of the recessed sections 31a are very small. This prevents a problem that currents flow in the portions of the amorphous barrier layers 40 that are in contact with the inside walls 31b when currents are applied between the electrode layers 43. That is, a problem of an increase in junction resistance can be prevented. This leads to an increase in output.

Since the bottoms 31c of the recessed sections 31a containing the amorphous barrier layers 40 are located higher than the lower face 23b of the antiferromagnetic layer 23, the upper faces 40a of the amorphous barrier layers 40 are located higher than the lower face 23b of the antiferromagnetic layer 23. Therefore, the bias layers 42 are located at high positions in the recessed sections 31a in the thickness direction (the Z1-Z2 direction in this figure); hence, the portions of the bias layers 42 that extend on the inside walls 31b of the recessed sections 31a toward the protective layers 44 can be prevented from being extremely tapered. The extending portions of the bias layers 42 arranged on both sides of the free magnetic layer 26 have a sufficiently large volume; hence, a large bias magnetic field can be applied to the free magnetic layer 26.

With reference back to FIG. 1, the free magnetic layer 26 has a single-layer structure. However, the present invention is not limited to such a structure and the free magnetic layer 26 may have a so-called multi-layered ferri-free structure in which a first magnetic sub-layer, a non-magnetic intermediate sub-layer, and a second magnetic sub-layer are arranged in that order. In this case, after the non-magnetic material layer 25 is formed in the step shown in FIG. 2, the free magnetic layer 26 may be formed in such a manner that the first magnetic sub-layer, the non-magnetic intermediate sub-layer, and the second magnetic sub-layer are formed on the non-magnetic material layer 25 in that order.

With reference back to FIG. 1, the pinned magnetic layer 24 has a three-layer structure referred to as a so-called multi-layered ferri-pinned structure. However, the present invention is not limited to such a structure and the pinned magnetic layer 24 may have a magnetic single-layer structure. In this case, after the antiferromagnetic layer 23 is formed in the step shown in FIG. 2, the pinned magnetic layer 24 having such a magnetic single-layer structure may be formed on the antiferromagnetic layer 23.

EXAMPLES

In examples of the present invention, samples having the same configuration as that of the magnetic detector 1 shown in FIG. 1 were prepared. The samples each included a seed layer 22 and a multilayer film 31, that is, the samples each included a Ni—Fe$_{38}$—Cr layer having a thickness of about 42 Å, a Pt—Mn layer having a thickness of about 140 Å, a Co—Fe layer having a thickness of about 16 Å, a Ru layer having a thickness of about 8.7 Å, a Co—Fe layer having a thickness of about 22 Å, a Cu layer having a thickness of about 19 Å, a Co—Fe layer having a thickness of about 10 Å, a Ni—Fe layer having a thickness of about 32 Å, and a Ta layer having a thickness of about 30 Å. The samples each further included amorphous barrier layers 40, made of $Al_2O_3$, having a thickness of about 27 to 37 Å; bias base layers 41, made of Cr, having a thickness of about 32 Å; bias layers 42, made of Co—Pt, having a thickness of about 150 Å; and protective layers 44, made of Ta, having a thickness of about 50 Å.

In comparative examples, samples having the same configuration as that of the magnetic detector 1 were prepared in such a manner that after recessed sections 31a were formed in a vacuum as shown in FIGS. 3 and 4, the vacuum was broken and amorphous barrier layers 40 were then formed as shown in FIG. 5. The sample of Comparative Example 1 included amorphous barrier layers 40, made of $Al_2O_3$, having a thickness of about 25 Å; the sample of Comparative Example 2 included amorphous barrier layers 40, made of $Al_2O_3$, having a thickness of about 50 Å; and sample of Comparative Example 3 included amorphous barrier layers 40, made of $Al_2O_3$, having a thickness of about 100 Å.

In the examples, the amorphous barrier layers 40 were formed in the same vacuum as that for forming recessed sections 31a with a vacuum deposition system as shown in FIG. 5 sequentially to the step of forming the recessed sections 31a as shown in FIGS. 3 and 4.

Figure 7:
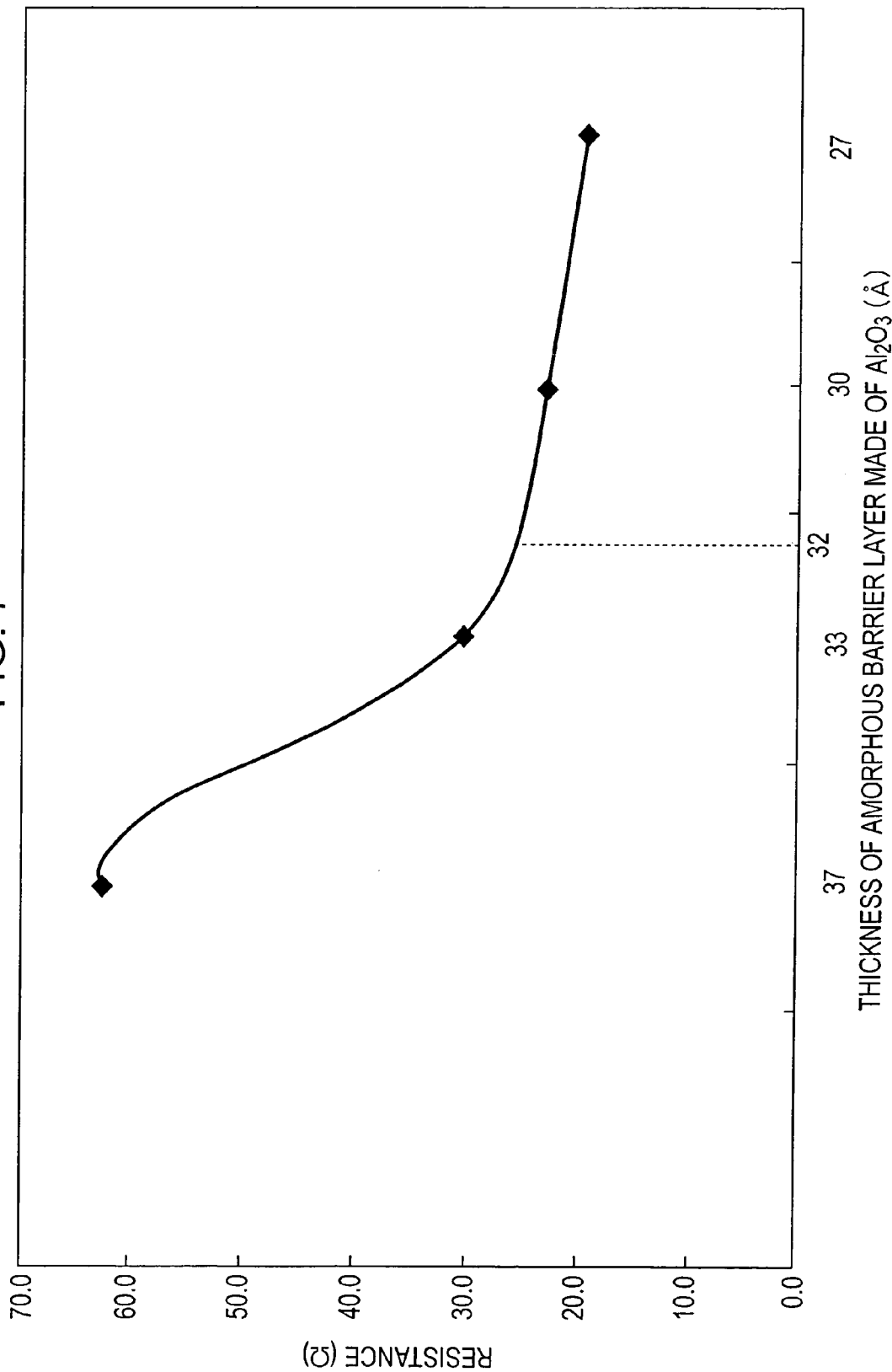
FIG. 7 is a graph showing the relationship between the resistance and the thickness of amorphous barrier layers included in a sample of an example of the present invention.
Figure 9:
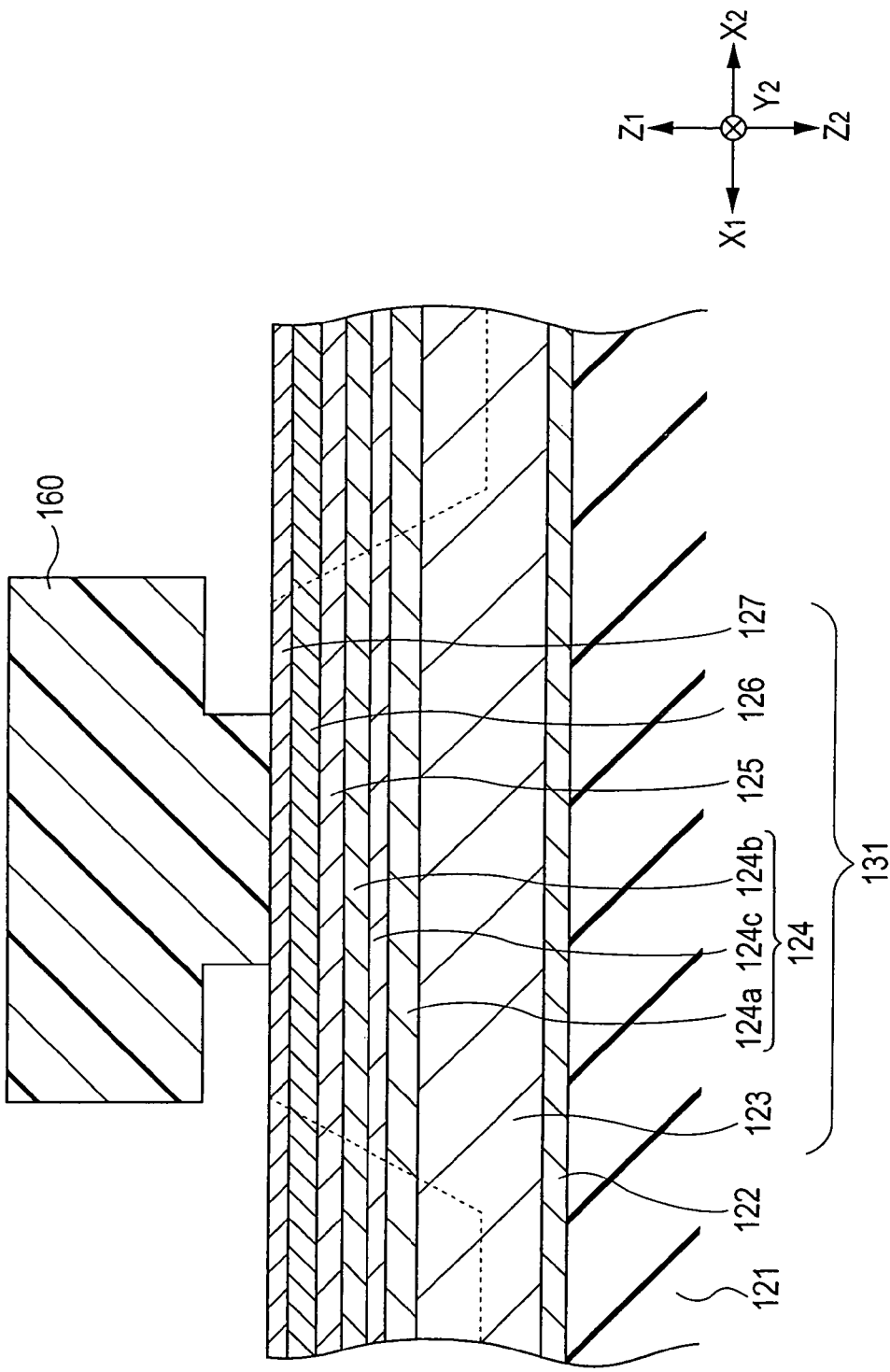
FIG. 9 is an illustration showing a step included in a method for manufacturing a known magnetic detector.
Figure 10:
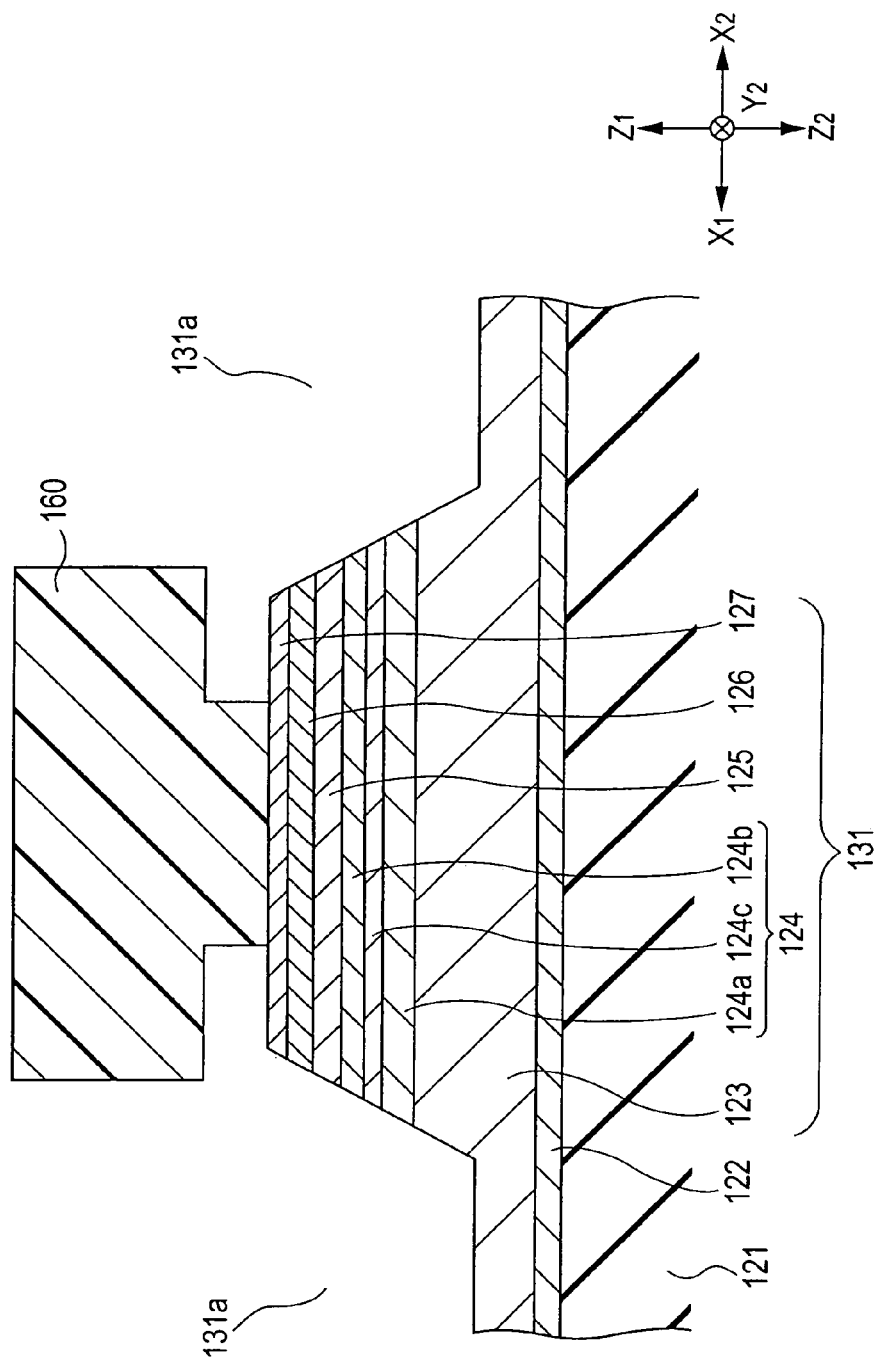
FIG. 10 is an illustration showing a step subsequent to the step shown in FIG. 9.
Figure 11:
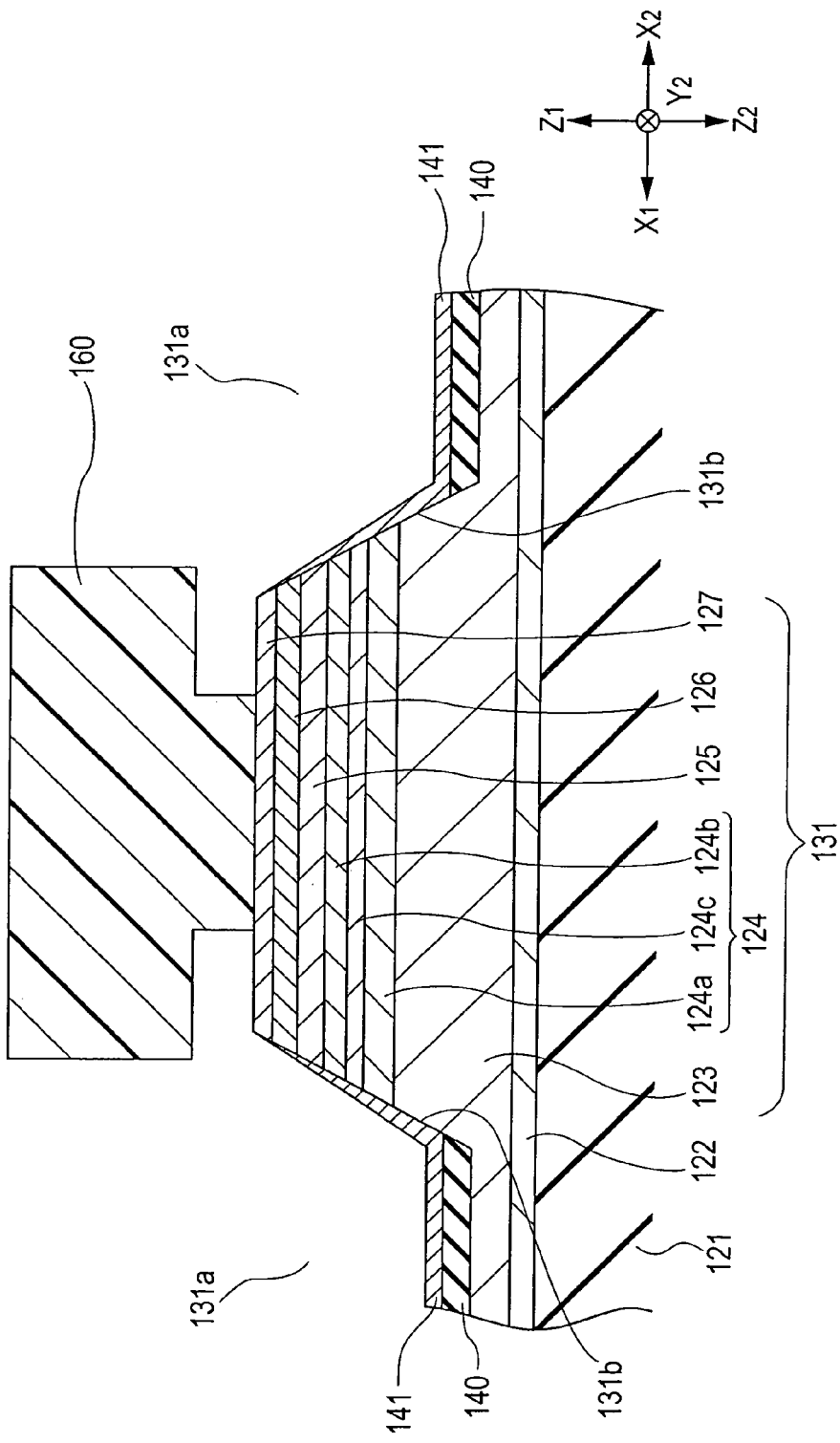
FIG. 11 is an illustration showing a step subsequent to the step shown in FIG. 10.
Figure 12:
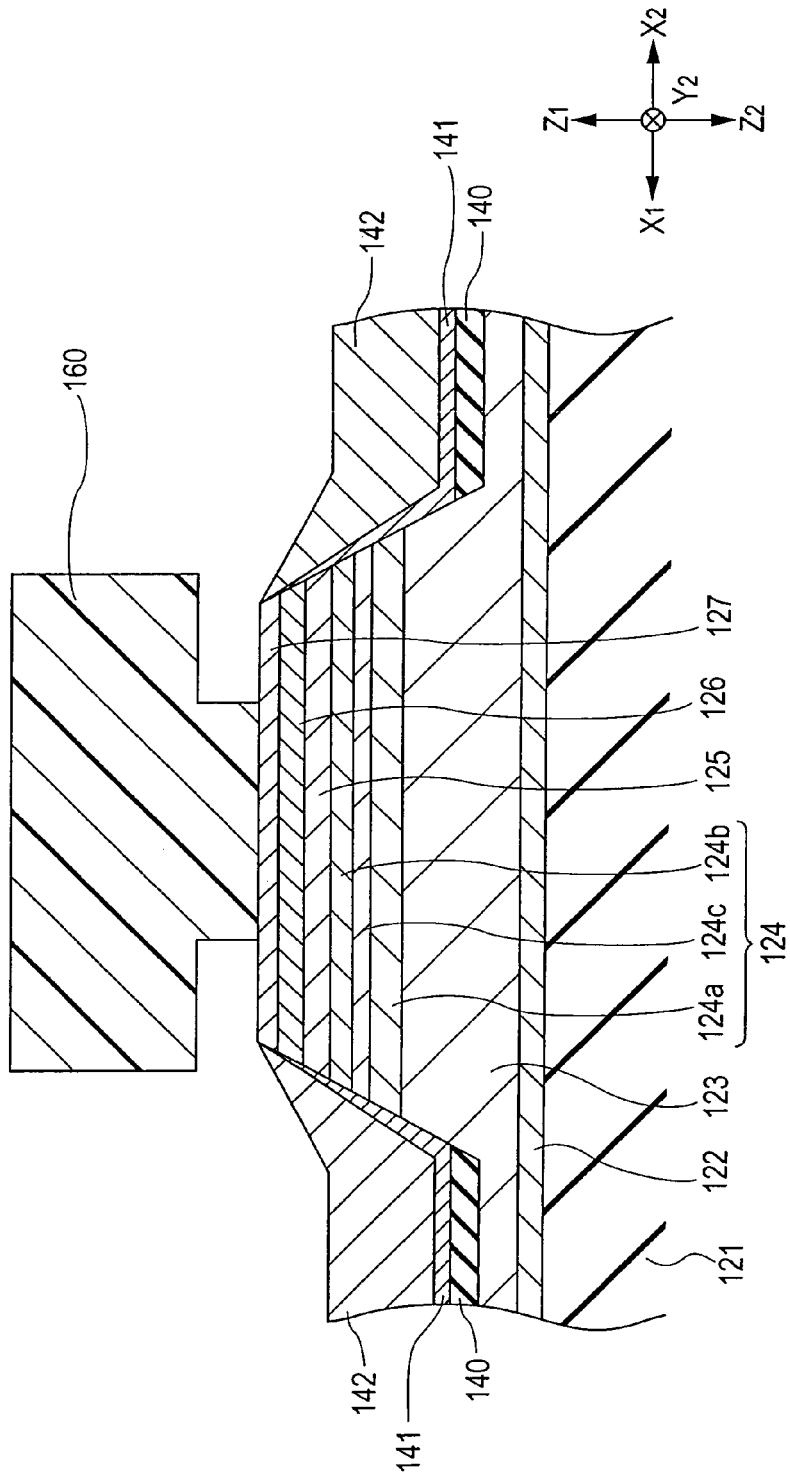
FIG. 12 is an illustration showing a step subsequent to the step shown in FIG. 11.
Figure 13:
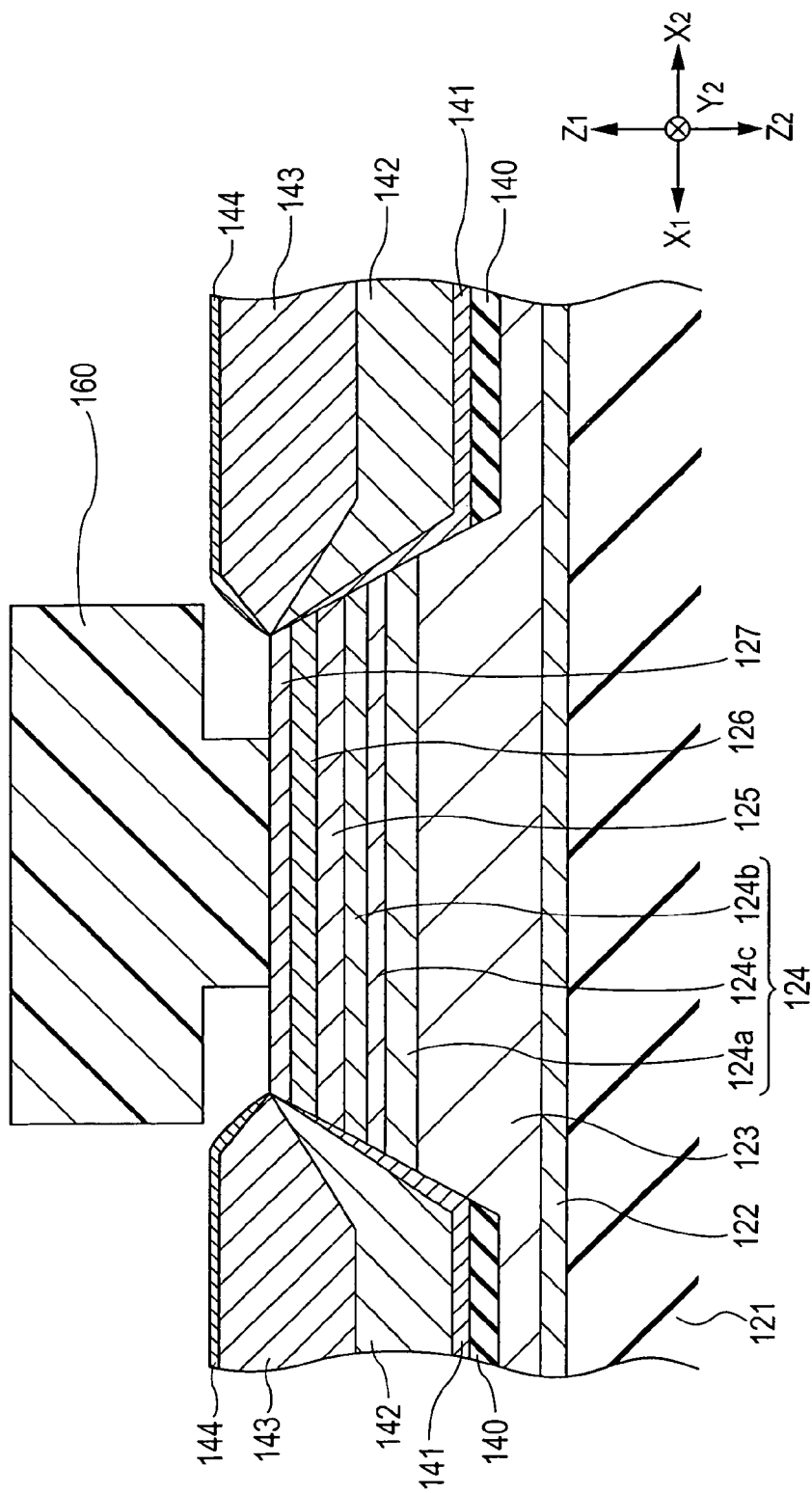
FIG. 13 is an illustration showing a step subsequent to the step shown in FIG. 12.
Figure 14:
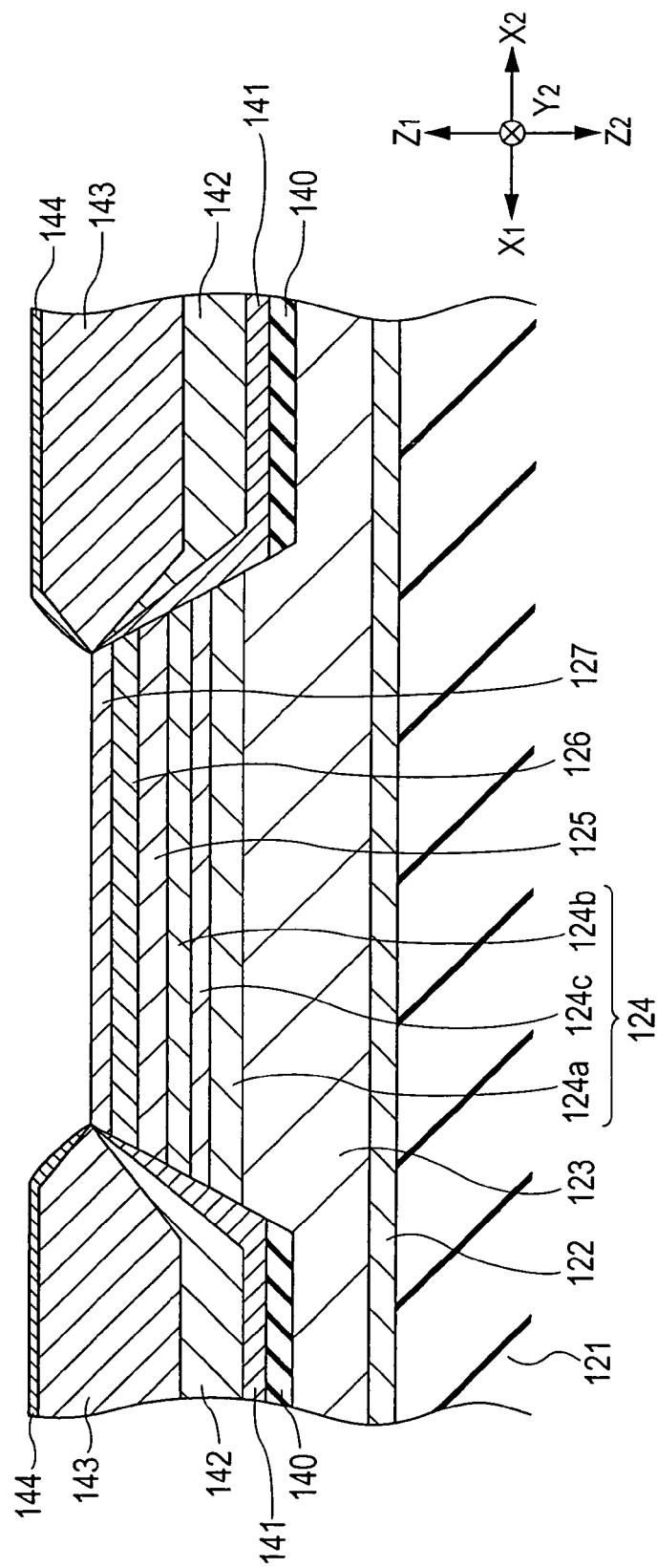
FIG. 14 is a fragmentary sectional view showing a known magnetic detector in such a manner that a face of this detector is viewed from a recording medium.

The samples, prepared in the examples, including the amorphous barrier layers 40 with a thickness of about 27 to 37 Å were measured for resistance (junction resistance). FIG. 7 shows the relationship between the thickness of the amorphous barrier layers 40 and the resistance (junction resistance) of these samples.

With reference to FIG. 7, when the amorphous barrier layers 40 have a thickness of more than about 32 Å, an increase in thickness sharply increases resistance (junction resistance). This shows that when the amorphous barrier layers 40 have a thickness of about 32 Å or less, the amorphous barrier layers 40 have low resistance (junction resistance).

A sample of another example of the present invention was prepared so as to include amorphous barrier layers 40, made of $Al_2O_3$, having a thickness of about 10 Å. This sample and the samples of Comparative Examples 1 to 3 were measured for magnetic properties. FIG. 8 shows the measurement, which is summarized in a table.

With reference to FIG. 8, the sample of this example has a smaller thickness but a larger coercive force (Hc) and squareness ratio (S) as compared to the samples of Comparative Examples 1 and 2. In order to prepare a sample with a coercive force (Hc) greater than that of the sample of this example in the same manner as that for preparing the samples of the comparative examples, this sample must have a large thickness of about 100 Å, that is, a thickness equal to that of the sample of Comparative Example 3. Although the sample of Comparative Example 3 has a thickness ten times greater than that of the sample of this example, the sample of Comparative Example 3 has a squareness ratio (S) less than that of the sample of this example.

What is claimed is:

1. A method for manufacturing a magnetic detector, comprising:
   Step (a) of forming a multilayer film above the substrate, the multilayer film including an antiferromagnetic layer, a pinned magnetic layer, a non-magnetic conductive layer, and a free magnetic layer;
   Step (b) of removing side regions of the multilayer film in a vacuum to form recessed sections such that bottoms of the recessed sections are located between an upper face and lower face of the antiferromagnetic layer;
   Step (c) of forming amorphous barrier layers on the bottoms of the recessed sections sequentially to Step (b) in the same vacuum as that used in Step (b) without breaking the vacuum state of Step (b), wherein the amorphous barrier layers are formed by sputtering performed in a direction to make an angle $\theta 1$ with the normal to the bottoms of the recessed sections, wherein the angle $\theta 1$ comprises a range of 0 to 10 degrees; and
   Step (d) of forming bias base layers, bias layers, and electrode layers on the amorphous barrier layers.

2. The method according to claim 1, wherein the amorphous barrier layers are formed in Step (c) so as to have a thickness of 10 to 32 Å.

3. The method according to claim 2, wherein the amorphous barrier layers are formed in Step (c) using an amorphous oxide containing at least one selected from the group consisting of Al, Cr, Ga, Si, Sn, Ta, Ti, Zn, and Zr.

4. The method according to claim 2, wherein the amorphous barrier layers are formed in Step (c) using an amorphous alloy containing at least one selected from the group consisting of Ta, Au, Ag, Cu, Mn, Nb, and Pd.

5. The method according to claim 2, wherein the amorphous barrier layers are formed in Step (c) using Ta.

6. The method according to claim 1, wherein the amorphous barrier layers are formed in Step (c) using an amorphous oxide containing at least one selected from the group consisting of Al, Cr, Ga, Si, Sn, Ta, Ti, Zn, and Zr.

7. The method according to claim 6, wherein the amorphous barrier layers are formed in Step (c) using at least one selected from the group consisting of $Al_2O_3$, $Ta_2O_5$, and $SiO_2$.

8. The method according to claim 1, wherein the amorphous barrier layers are formed in Step (c) using an amorphous alloy containing at least one selected from the group consisting of Ta, Au, Ag, Cu, Mn, Nb, and Pd.

9. The method according to claim 1, wherein the amorphous barrier layers are formed in Step (c) using Ta.

* * * * *

UNITED STATES PATENT AND TRADEMARK OFFICE
CERTIFICATE OF CORRECTION

PATENT NO.          : 7,443,635 B2
APPLICATION NO.  : 11/249751
DATED                  : October 28, 2008
INVENTOR(S)         : Kenichi Tanaka et al.

It is certified that error appears in the above-identified patent and that said Letters Patent is hereby corrected as shown below:

On the Title Page, item [57]

In column 2, line 9, under "ABSTRACT", after "with a thickness of" insert --10 to 32--.

Signed and Sealed this

Third Day of March, 2009

JOHN DOLL
*Acting Director of the United States Patent and Trademark Office*